(12) United States Patent
Lai et al.

(10) Patent No.: US 6,759,872 B2
(45) Date of Patent: Jul. 6, 2004

(54) I/O CIRCUIT WITH MIXED SUPPLY VOLTAGE CAPABILITY

(75) Inventors: Eric Lai, Cupertino, CA (US); Ronald de Vries, San Jose, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/100,357

(22) Filed: Mar. 14, 2002

(65) Prior Publication Data

US 2003/0173994 A1 Sep. 18, 2003

(51) Int. Cl.[7] .................................................. H03K 3/00
(52) U.S. Cl. ............................ 326/81; 326/83; 326/86; 326/68; 326/62; 327/333; 327/112
(58) Field of Search ............................... 326/62, 63, 68, 326/80, 81, 83, 86; 327/333, 112, 99, 407, 538

(56) References Cited

U.S. PATENT DOCUMENTS 5,894,423 A * 4/1999 Ling et al. .................. 700/293

6,323,704 B1 * 11/2001 Pelley et al. ................. 327/112

OTHER PUBLICATIONS

Marcel J.M. Pelgrom and E.Carel Dijkmans, "A 3/5 V Compatible I/O Buffer", IEEE Journal of Solid State Circuits, No. 7, Jul. 1995, pp. 823–825, vol. 30.

* cited by examiner

*Primary Examiner*—Vibol Tan
(74) *Attorney, Agent, or Firm*—Aaron Waxler

(57) ABSTRACT

The present invention provides an improved input/output (I/O) circuit that comprises a pair of buffers, a voltage reference circuit that provides first and second reference voltages to the buffers respectively, and a detection circuit. The detection circuit detects whether a supply voltage is below a switching voltage, which is a pre-selected value between operating ranges of two pre-defined supply voltages, e.g., 3.3V and 5V, respectively. If the supply voltage is below the switching voltage, the detection circuit controls the voltage reference circuit to set the first and second reference voltages to first and second predetermined values, e.g., a ground level and the supply voltage, respectively. In this way, the large signal swings of the signals output by the buffers can be substantially maintained. Therefore, high speed operations can be achieved.

15 Claims, 3 Drawing Sheets

I/O CIRCUIT WITH MIXED SUPPLY VOLTAGE CAPABILITY

BACKGROUND OF THE INVENTION

The invention relates generally to semiconductor integrated circuit (IC) devices and more particularly, it relates to input/output (I/O) circuits with mixed supply voltage capability.

In the semiconductor industry, power reduction, die size reduction and higher speed have been major driving forces in improving the performance of integrated circuits (ICs). In particular, low power ICs offer numerous advantages. For example, low power ICs allow high density devices to be manufactured, which are particularly suitable for mobile devices. The current trend is to reduce the standard supply voltage Vcc from 5V to 3.3V and even lower. FIG. 1 shows a typical conventional high voltage input/output (I/O) circuit 10 in a low voltage technology. I/O circuit 10 includes a level shifter 4, buffers 18 and 26, a voltage reference circuit 12, and an output stage 36. I/O circuit 10 is powered by Vcc, which may be the standard 5V or a lower supply voltage of 3.3 V, and receives an input voltage Vin switching between 0–3.3V. Voltage reference circuit 12 provides reference voltages $V_{RP}$ and $V_{RN}$ to buffers 18 and 20, respectively. The voltage across buffers 18 and 20 should generally stay within the maximum voltage the process can handle. In other words, the voltage differences between Vcc and $V_{RP}$ and between $V_{RN}$ and ground level should be less than the maximum voltage the process can handle. This usually means that in a 3.3V process VRP is around 1.7V (5.5–3.3V) and $V_{RN}$ is around 3.3V when Vcc is 5V. In the case Vcc is 5V, voltage input Vin of 0–3.3V is level shifted to 1.7–5V by level shifter 14 and is input to buffer 18. Buffer 18, which has a signal swing between $V_{RP}$ and Vcc, i.e., between 1.7 and 5V, outputs signals between 1.7–5V to output stage 36. On the other hand, buffer 26 has a signal swing between a ground level and $V_{RN}$, i.e., between 0 and 3.3V and outputs signals between 0–3.3V to output stage 36. Output stage 36 then output signals between 0–5V.

I/O circuit 10 works properly when a 5V supply voltage is applied. However, I/O circuit 10 will not operate properly when a 3.3 supply voltage is applied. In the latter case, buffer 18 will have a smaller signal swing between 1.7 to 3.3V. Such a smaller signal swing causes the speed of I/O circuit 10 to become very slow such that it does not meet the high speed requirements of many applications. This is because for optimal operation of a CMOS circuit sufficient "headroom" is required. Headroom is the difference between the supply voltage to buffers 18 and 20 and threshold voltages of their transistors.

Therefore, there is a need for a driver circuit with superior performance.

SUMMARY OF THE INVENTION

The present invention provides a solution that addresses the limiting factors of the conventional I/O circuits. According to one embodiment of the invention, there is provided an I/O circuit to be powered by a supply voltage. The I/O circuit comprises a pair of buffers, each of which is responsive to input signals and configured to provide signals of sufficiently large signal swings to allow high speed operations; a voltage reference circuit, operably coupled to the pair of buffers, that is configured to provide first and second reference voltages to the pair of buffers respectively; and a detection circuit, operably coupled to voltage reference circuit, that is configured to detect whether the supply voltage is below a switching voltage. The switching voltage is a pre-selected value between operating ranges of two pre-defined supply voltages, which, for example, may be 3.3V and 5V, respectively. Alternatively, they may be 2.5V and 3.3V, respectively. If the supply voltage is below the switching voltage, the detection circuit controls the voltage reference circuit to set the first and second reference voltages to first and second predetermined values, respectively. According to one embodiment of the invention, the first and second predetermined values are a ground level and the supply voltage, respectively. In this way, the large signal swings of the signals output by the buffers can be substantially maintained. Therefore, the high speed operations can be achieved.

Other objects and attainments together with a fuller understanding of the invention will become apparent and appreciated by referring to the following description and claims taken in conjunction with the accompanying drawings.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION OF THE PREFERRED EMBODIMENTS

Figure 1:
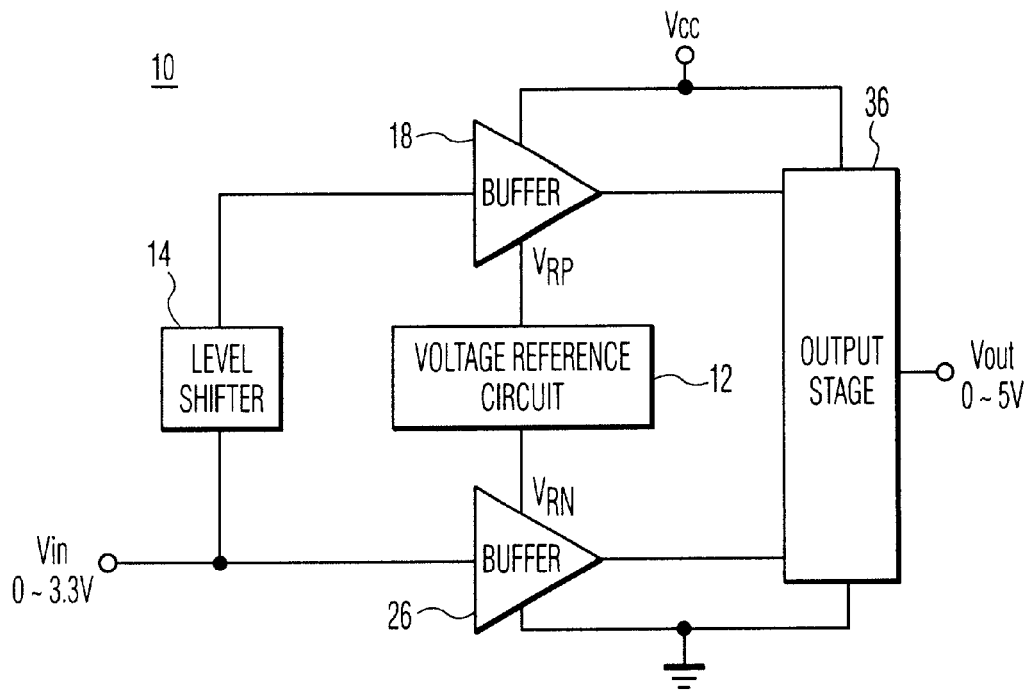
FIG. 1 shows a typical conventional I/O circuit.
Figure 2:
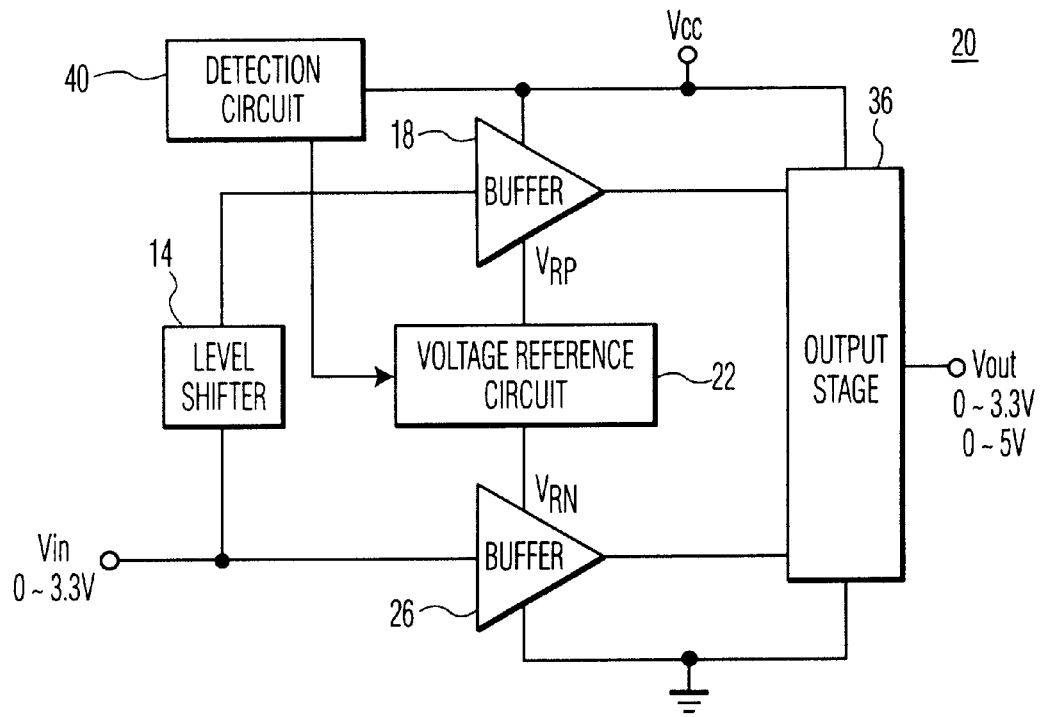
FIG. 2 shows an I/O circuit according to one embodiment of the invention.

FIG. 2 shows an I/O circuit 20 according to one embodiment of the invention. I/O circuit 20 includes level shifter 14, buffers 18 and 26, a voltage reference circuit 22, a detection circuit 40 and an output voltage stage 36. In operation, detection circuit 40 detects a value of a supply voltage Vcc applied to I/O circuit 20. If supply voltage Vcc is in the 5V operating range (i.e., 5V±10%), then detection circuit 40 takes no action and the normal operation is performed by I/O circuit 20 in a similar manner as I/O circuit 10 in FIG. 1.

On the other hand, if detection circuit 40 detects that the supply voltage Vcc is below a predefined level referred to as a "switching voltage," then detection circuit 40 controls voltage reference circuit 22 to force the values of reference voltages $V_{RP}$ and $V_{RN}$ to be ground (GND) and Vcc, respectively. Thus, each of buffers 18 and 26 will have a sufficiently large signal swing between GND to Vcc (e.g., 0 to 3.3V) to meet the high speed requirements of many applications. Therefore, by maintaining the large signal swing at both buffers 18 and 26, high speed performance can be achieved even when the supply voltage Vcc is below the standard 5V operating range.

Figure 3:
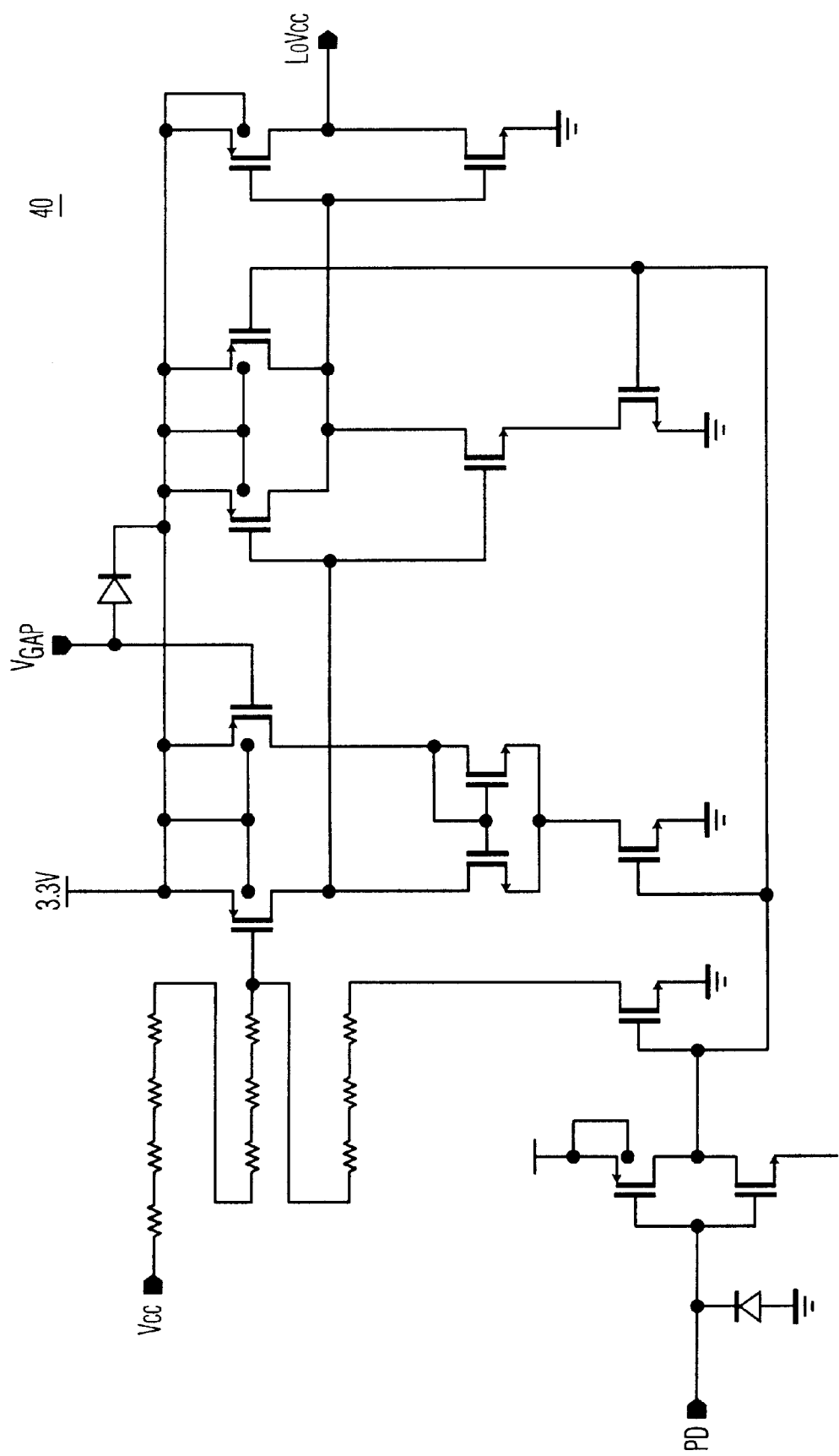
FIG. 3 shows an exemplary schematic diagram of the detection circuit according to one embodiment of the invention.

FIG. 3 shows an exemplary schematic diagram of detection circuit 40 according to one embodiment of the invention, which, as described above, detects whether supply voltage Vcc is below the switching voltage. In this example, the switching voltage is selected between the higher end of the 3.3V operating range (3.3±10%) and the lower end of the 5V operating range (5.5±10%), i.e., between 3.63V and 4.5V. Thus, a convenient value 4.1 V, which is about half way between these two values, is selected, although any other value between 3.63 and 4.5V may be chosen as the switching voltage. In FIG. 3, detection circuit 40 detects whether supply voltage Vcc is less than the switching voltage of 4.1V by comparing a reference voltage $V_{GAP}$ of approximately 1.2 V with a fraction of the supply voltage Vcc. If Vcc is less than the switching voltage, i.e., the fraction of Vcc is less than $V_{GAP}$, the result $L_O$Vcc is output to voltage reference circuit 22 to set the reference voltages $V_{RP}$ and $V_{RN}$ to GND and Vcc, respectively, to allow buffers 18 and 26 to maintain large signal swings. In an alternative embodiment, Vcc may be compared directly with the switching voltage.

In FIG. 3, a signal PD is used to control an optional power-down switch for switching off the resistor string when the device is powered down in order to get a low power supply current.

Figure 4:
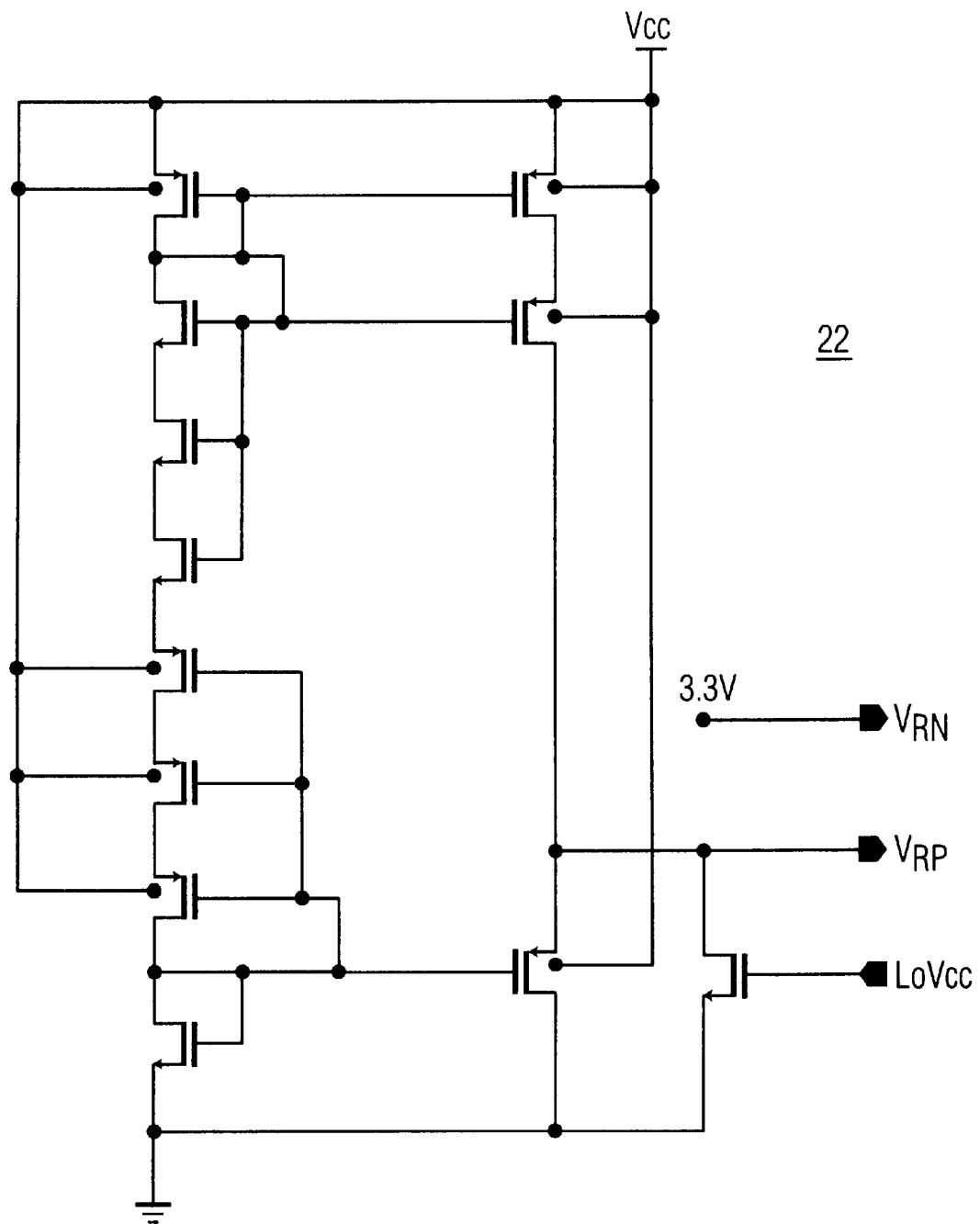
FIG. 4 shows an exemplary schematic diagram of the voltage reference circuit according to one embodiment of the invention.

FIG. 4 shows an exemplary schematic diagram of voltage reference circuit 22 according to one embodiment of the invention. In this embodiment, the reference voltage $V_{RN}$ is always connected to a constant voltage, e.g., 3.3V, and $V_{RP}$ is set to GND by circuit 22 upon receiving the signal $L_O$Vcc from detection circuit 40.

It should be noted that although the I/O circuit of the invention is described in connection with supply voltages of 3.3V and 5V, the I/O circuit can also operate with other mixed supply voltages, e.g., 2.5V and 3.3V.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims.

What is claimed is:

1. An input/output (I/O) circuit, comprising:
    a pair of buffers, each of which is configured to produce an output signal having a signal swing responsive to an input signal;
    an output stage operably coupled to the pair of buffers, that is configured to receive the output signals of the pair of buffers, the output stage coupled between a first supply voltage and ground;
    a voltage reference circuit, operably coupled to the pair of buffers, that is configured to provide first and second reference voltages to the pair of buffers respectively, wherein the signal swing of each of the pair of buffers is based respectively, at least in part, on the first and second reference voltages; and
    a detection circuit, operably coupled to the voltage reference circuit that is configured to detect whether the first supply voltage is below a switching voltage and to control the voltage reference circuit to set the first and second reference voltages to first and second predetermined values, respectively, if the supply voltage is below the switching voltage so as to obtain signal swings between the supply voltage and ground.

2. The circuit of claim 1, further comprising a level shifter, operably coupled to a first one of the pair of buffers, that is configured to convert the input signals to high amplitude signals and output the high amplitude signals to the first one of the buffers.

3. The circuit of claim 1, wherein the switching voltage is a pre-selected value between operating ranges of two pre-defined supply voltages.

4. The circuit of claim 3, wherein the two supply voltages are 3.3V and 5V, respectively.

5. The circuit of claim 3, wherein the two supply voltages are 2.5V and 3.3V, respectively.

6. The circuit of claim 1, wherein the voltage reference circuit sets initial values of the first and second reference voltages to one half of the supply voltage.

7. The circuit of claim 1, wherein each of the second reference voltage and the second predetermined value is equal to a fixed voltage level.

8. The circuit of claim 1, wherein the first and second predetermined values are a ground level and the supply voltage, respectively.

9. The circuit of claim 8, wherein the supply voltage is 3.3V.

10. A system, comprising;
    a processor that is configured to process external signals and provide output signals; and
    an input/output (I/O) circuit to be powered by a supply voltage, the I/O circuit including:
        a pair of buffers, each of which is configured to produce an output signal having a signal swing responsive to an input signal;
        an output stage operably coupled to the pair of buffers, that is configured to receive the output signals of the pair of buffers, the output stage coupled between a first supply voltage and ground;
        a voltage reference circuit, operably coupled to the pair of buffers, that is configured to provide first and second reference voltages to the pair of buffers respectively, wherein the signal swing of each of the pair of buffers is based respectively, at least in part, on the first and second reference voltages; and
        a detection circuit, operably coupled to the voltage reference circuit, that is configured to detect whether the first supply voltage is below a switching voltage and to control the voltage reference circuit to set the first and second reference voltages to first and second predetermined values, respectively, if the supply voltage is below the switching voltage so as to obtain signal swings between the supply voltage and ground.

11. The system of claim 10, wherein the switching voltage is a pre-selected value between operating ranges of two pre-defined supply voltages.

12. The system of claim 11, wherein the two supply voltages are 3.3V and 5V, respectively.

13. The system of claim 10, wherein each of the second reference voltage and the second predetermined value is equal to a fixed voltage level.

14. The system of claim 10, wherein the first and second predetermined values are a ground level and the supply voltage, respectively.

15. The system of claim 14, wherein the supply voltage is 3.3V.

* * * * *